(12) United States Patent
Kato et al.

(10) Patent No.: US 9,633,989 B2
(45) Date of Patent: Apr. 25, 2017

(54) ESD PROTECTION DEVICE

(71) Applicant: Murata Manufacturing Co., Ltd., Nagaokakyo-shi, Kyoto-fu (JP)

(72) Inventors: Noboru Kato, Nagaokakyo (JP); Toshiyuki Nakaiso, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/835,959

(22) Filed: Aug. 26, 2015

(65) Prior Publication Data

US 2015/0364461 A1 Dec. 17, 2015

Related U.S. Application Data

(63) Continuation of application No. PCT/JP2014/054404, filed on Feb. 25, 2014.

(30) Foreign Application Priority Data

| | | |
|---|---|---|
| Feb. 28, 2013 | (JP) | 2013-039379 |
| Apr. 5, 2013 | (JP) | 2013-079960 |

(Continued)

(51) Int. Cl.
*H01L 27/02* (2006.01)
*H01L 27/08* (2006.01)
(Continued)

(52) U.S. Cl.
CPC ........ *H01L 27/0255* (2013.01); *H01L 23/528* (2013.01); *H01L 27/0814* (2013.01);
(Continued)

(58) Field of Classification Search
CPC .............. H01L 23/528; H01L 27/0255; H01L 27/0814; H01L 29/866
See application file for complete search history.

(56) References Cited

U.S. PATENT DOCUMENTS

| | | |
|---|---|---|
| 5,311,042 A | 5/1994 | Anceau |
| 5,416,358 A | 5/1995 | Ochi et al. |

(Continued)

FOREIGN PATENT DOCUMENTS

| | | |
|---|---|---|
| JP | H04-17375 A | 1/1992 |
| JP | H05-218459 A | 8/1993 |

(Continued)

OTHER PUBLICATIONS

International Search Report issued for PCT/JP2014/054404, date of mailing May 27, 2014.

(Continued)

*Primary Examiner* — Christine Enad
(74) *Attorney, Agent, or Firm* — Arent Fox LLP

(57) ABSTRACT

An ESD protection device includes a zener diode, and a series circuit of diodes and a series circuit of diodes that are connected in parallel with the zener diode. At the connection point between the diodes, an Al electrode film is formed on the surface of a Si substrate, and at the connection point between diodes, an Al electrode film is formed on the surface of the Si substrate. The diodes are formed on the surface of the Si substrate, and the diodes are formed in the thickness direction of the Si substrate. The Si substrate has a longitudinal direction and a shorter direction orthogonal to the longitudinal direction in planar view, and the Al electrode films are formed respectively at both ends in the shorter direction of the Si substrate. Thus, provided is an ESD protection device which suppresses the ESL, and keeps the clamp voltage low.

19 Claims, 10 Drawing Sheets

(30) Foreign Application Priority Data

| Apr. 5, 2013 | (JP) | 2013-079978 |
|---|---|---|
| May 7, 2013 | (JP) | 2013-097494 |
| May 31, 2013 | (JP) | 2013-115676 |
| Jun. 17, 2013 | (JP) | 2013-126659 |
| Jul. 18, 2013 | (JP) | 2013-149004 |

(51) Int. Cl.
  *H01L 23/528* (2006.01)
  *H01L 29/866* (2006.01)
  *H01L 29/861* (2006.01)

(52) U.S. Cl.
  CPC ......... *H01L 29/866* (2013.01); *H01L 29/8611* (2013.01); *H01L 29/8613* (2013.01); *H01L 2224/16* (2013.01)

(56) References Cited

U.S. PATENT DOCUMENTS

| 7,285,867 | B2 | 10/2007 | Matsuzaki | |
|---|---|---|---|---|
| 7,579,632 | B2* | 8/2009 | Salih | H01L 23/60 257/173 |
| 8,456,856 | B2 | 6/2013 | Lin | |
| 8,558,383 | B2* | 10/2013 | Lin | H01L 21/2885 257/758 |
| 8,710,645 | B2 | 4/2014 | Shau | |
| 2004/0016971 | A1 | 1/2004 | Abe et al. | |
| 2005/0006760 | A1 | 1/2005 | Terui | |
| 2007/0073807 | A1 | 3/2007 | Bobde | |
| 2007/0086129 | A1 | 4/2007 | Vos et al. | |
| 2007/0210317 | A1* | 9/2007 | Chou | H01L 25/167 257/79 |
| 2008/0121988 | A1 | 5/2008 | Mallikararjunaswamy et al. | |
| 2008/0265421 | A1 | 10/2008 | Brunnbauer et al. | |
| 2009/0079001 | A1* | 3/2009 | Salih | H01L 23/60 257/355 |
| 2010/0155962 | A1 | 6/2010 | Inoue | |
| 2010/0301459 | A1 | 12/2010 | Akiba et al. | |
| 2010/0314660 | A1* | 12/2010 | Salih | H01L 27/0255 257/173 |
| 2011/0309472 | A1 | 12/2011 | Nakaiso | |
| 2012/0068299 | A1* | 3/2012 | Lin | H01L 27/0255 257/510 |
| 2012/0326207 | A1* | 12/2012 | Yoshimochi | H01L 29/866 257/139 |
| 2013/0099353 | A1 | 4/2013 | Kato et al. | |
| 2013/0168837 | A1 | 7/2013 | Kato et al. | |
| 2014/0332937 | A1 | 11/2014 | Brunnbauer et al. | |
| 2015/0371984 | A1 | 12/2015 | Kato et al. | |

FOREIGN PATENT DOCUMENTS

| JP | H05-268123 A | 10/1993 |
|---|---|---|
| JP | H11-54708 A | 2/1999 |
| JP | 2002-176106 A | 6/2002 |
| JP | 2002-252309 A | 9/2002 |
| JP | 2002270720 A | 9/2002 |
| JP | 2003-124222 A | 4/2003 |
| JP | 2004-119870 A | 4/2004 |
| JP | 2004-158758 A | 6/2004 |
| JP | 2004-281898 A | 10/2004 |
| JP | 2005-032782 A | 2/2005 |
| JP | 2005-340573 A | 12/2005 |
| JP | 2006173476 A | 6/2006 |
| JP | 2007-123538 A | 5/2007 |
| JP | 2008049511 A | 2/2008 |
| JP | 2008141136 A | 6/2008 |
| JP | 2008-277742 A | 11/2008 |
| JP | 2009-016882 A | 1/2009 |
| JP | 2009515323 A | 4/2009 |
| JP | 2010-087113 A | 4/2010 |
| JP | 2010-510662 A | 4/2010 |
| JP | 2010-512003 A | 4/2010 |
| JP | 2010-278040 A | 12/2010 |
| JP | 2012-146717 A | 8/2012 |
| JP | 2012-182381 A | 9/2012 |
| WO | WO 2011/152255 A1 | 12/2011 |
| WO | WO 2012/023394 A1 | 2/2012 |
| WO | WO 2014162795 A1 | 10/2014 |

OTHER PUBLICATIONS

Written Opinion of the International Searching Authority for PCT/JP2014/054404, date of mailing May 27, 2014.
International Search Report issued for PCT/JP2014/054406, date of mailing May 27, 2014.
International Search Report issued for PCT/JP2014/054407, date of mailing May 27, 2014.
Written Opinion of the International Search Authority for PCT/JP2014/054403, date of mailing May 27, 2014.
Written Opinion of the International Search Authority for PCT/JP2014/054406, date of mailing May 27, 2014.
Written Opinion of the International Search Authority for PCT/JP2014/054407, date of mailing May 27, 2014.
International Search Report issued for PCT/JP2014/054403, date of mailing May 27, 2014.

* cited by examiner

ESD PROTECTION DEVICE

CROSS REFERENCE TO RELATED APPLICATIONS

The present application is a continuation of PCT/JP2014/054404 filed Feb. 25, 2014, which claims priority to JP Application No. 2013-149004, filed Jul. 18, 2013, JP Application No. 2013-126659, filed Jun. 17, 2013, JP Application No. 2013-115676, filed May 31, 2013, JP Application No. 2013-097494, filed May 7, 2013, JP Application No. 2013-079960, filed Apr. 5, 2013, JP Application No. 2013-079978, filed Apr. 5, 2013, and JP Application No. 2013-039379, filed Feb. 28, 2013, the entire contents of each of which are incorporated herein by reference.

FIELD OF THE INVENTION

The present invention relates to an ESD protection device which protects an electronic circuit from electrostatic discharge.

BACKGROUND OF THE INVENTION

ESD (Electro-Static-Discharge) protection devices can be a type of semiconductor devices. The ESD protection device protects semiconductor ICs, etc. from static electricity, etc. Various electronic devices including mobile communication terminals, digital cameras, and laptop PCs are provided with semiconductor integrated circuits constituting logic circuits, memory circuits, etc. Such semiconductor integrated circuits are low-voltage drive circuits composed of micro wiring patterns formed on semiconductor substrates, and thus generally fragile against electrostatic discharge such as surge. Therefore, ESD protection devices are used for protecting such semiconductor integrated circuits from surge. Patent Document 1 discloses a bidirectional ESD protection circuit which can cope with surge in any of the forward direction and reverse direction.

Patent Document 1: JP 5-268123 A.

In recent years, there has been a large number of electronic devices that make full use of high-frequency techniques. In the high-frequency range, the current supply efficiency depends on the ESR (equivalent series resistance), ESL (equivalent series inductance), and parasitic capacitance, etc. generated on the transmission path, which cause an energy loss. In particular, in the case of using an ESD protection circuit in the high-frequency band, the clamp voltage is increased as the ESL is increased, and there are thus problems such as failure to protect a semiconductor integrated circuit from surge. This problem is not able to be solved by Patent Document 1.

SUMMARY OF THE INVENTION

Therefore, an object of the present invention is to provide an ESD protection device which suppresses the ESL, and keeps the clamp voltage low.

The ESD protection device according to the present invention includes: a zener diode formed in a semiconductor substrate; a first series circuit formed in the semiconductor substrate, which has a first diode and a second diode aligned in the forward direction and connected in series, and aligned in the forward direction and connected in parallel with the zener diode; a second series circuit formed in the semiconductor substrate, which has a third diode and a fourth diode aligned in the forward direction and connected in series, and aligned in the forward direction and connected in parallel with the zener diode; a first input/output electrode connected to the connection point between the first diode and the second diode, and formed on the surface of the semiconductor substrate; and a second input/output electrode connected to the connection point between the third diode and the fourth diode, and formed on the surface of the semiconductor substrate, and characteristically, the first diode and the third diode are formed on the surface of the semiconductor substrate, the second diode and the fourth diode are formed in the thickness direction of the semiconductor substrate, the semiconductor substrate has a longitudinal direction and a shorter direction orthogonal to the longitudinal direction in planar view, and the first input/output electrode and the second input/output electrode are formed at both ends in the shorter direction of the semiconductor substrate.

In this configuration, the first and second input/output electrodes of the ESD protection device is formed in closer positions on the semiconductor substrate, and the current pathway of the ESD protection device can be thus shortened. As a result, the generation of ESL can be suppressed, and the increase in clamp voltage can be avoided.

Preferably, the ESD protection device includes a rewiring layer formed on the surface of the semiconductor substrate, the rewiring layer includes a first wiring electrode and a second wiring electrode opposed to the surface of the semiconductor substrate, a first contact hole that electrically connects the first input/output electrode and a part of the first wiring electrode, and a second contact hole that electrically connects the second input/output electrode and a part of the second wiring electrode, the rewiring layer has a first opening and a second opening formed in planar view for partially exposing the first wiring electrode and the second wiring electrode, and the first opening and the second opening are formed at both ends in the longitudinal direction of the semiconductor substrate.

This configuration makes it easy to mount the ESD protection device onto a substrate, because the first opening and the second opening which serve as external input/output terminals of the ESD protection device are provided at both ends in the longitudinal direction of the semiconductor substrate.

Preferably, the first diode has two diodes opposite to each other in forward direction from the first input/output electrode in the planar direction of the semiconductor substrate, whereas the third diode has two diodes opposite to each other in forward direction from the second input/output electrode in the planar direction of the semiconductor substrate.

In this configuration, when currents flow through the two diodes, the current flow in directions opposite to each other, and magnetic fields generated by the current flows thus cancel each other out. For this reason, the inductance of the current pathway is reduced, and lower ESL can be achieved.

According to the present invention, the shortened current pathway of the ESD protection device can suppress the generation of ESL and keeps the clamp voltage low.

DETAILED DESCRIPTION

Figure 1:
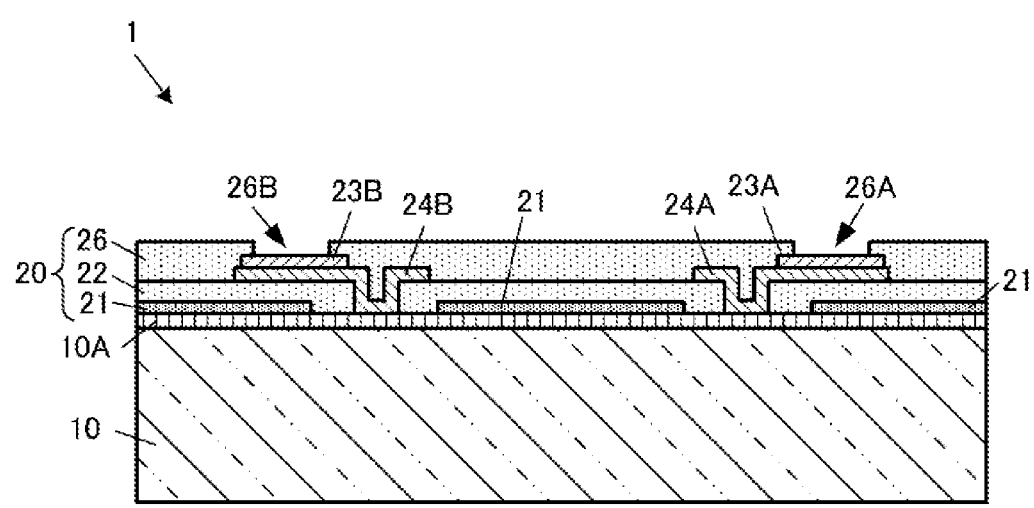
FIG. 1 is a front cross-sectional view of an ESD protection device according to an embodiment.
Figure 2:
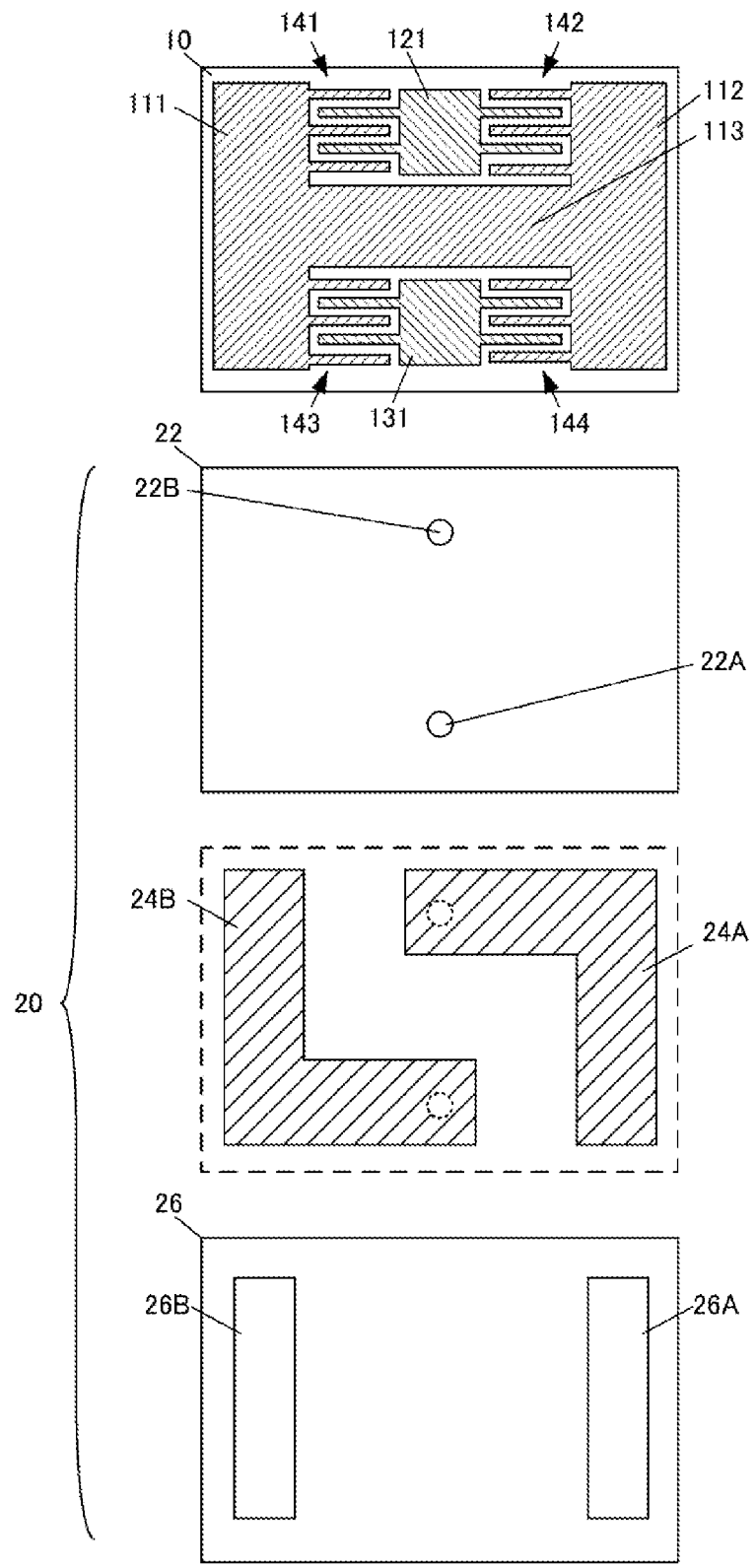
FIG. 2 is a plan view of respective layers of the ESD protection device.

FIG. 1 is a front cross-sectional view of an ESD protection device 1 according to the present embodiment. FIG. 2 is a plan view of respective layers of the ESD protection device 1. The ESD protection device 1 is a CSP (Chip Size Package) type device, where a rewiring layer 20 including multiple resin layers, etc. is formed on a Si substrate 10. The Si substrate 10 has a rectangular shape with long sides and short sides in planar view, and has an ESD protection circuit 10A configured to include diodes and a zener diode. While the Si substrate 10 corresponds to a semiconductor substrate according to the present invention, the semiconductor substrate according to the present invention is not limited to any Si substrate, but may be a GaAs substrate or the like.

Figure 3:
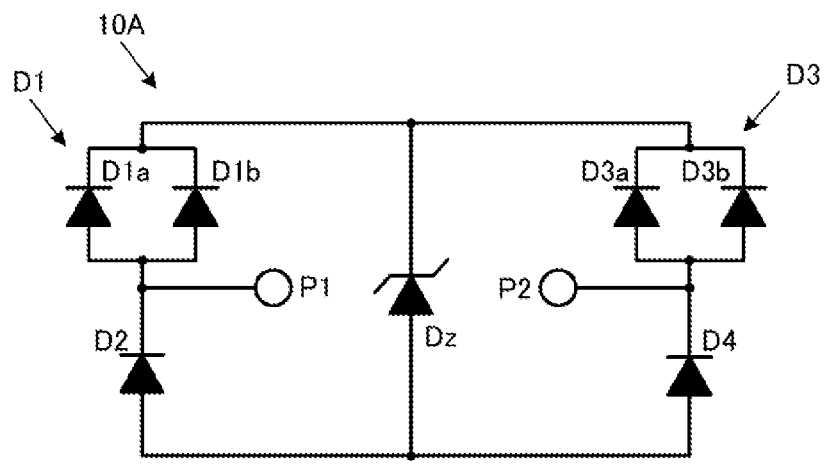
FIG. 3 is a diagram illustrating an ESD protection circuit formed on a Si substrate.

FIG. 3 is a diagram illustrating the ESD protection circuit 10A formed on the Si substrate 10.

Figure 4:
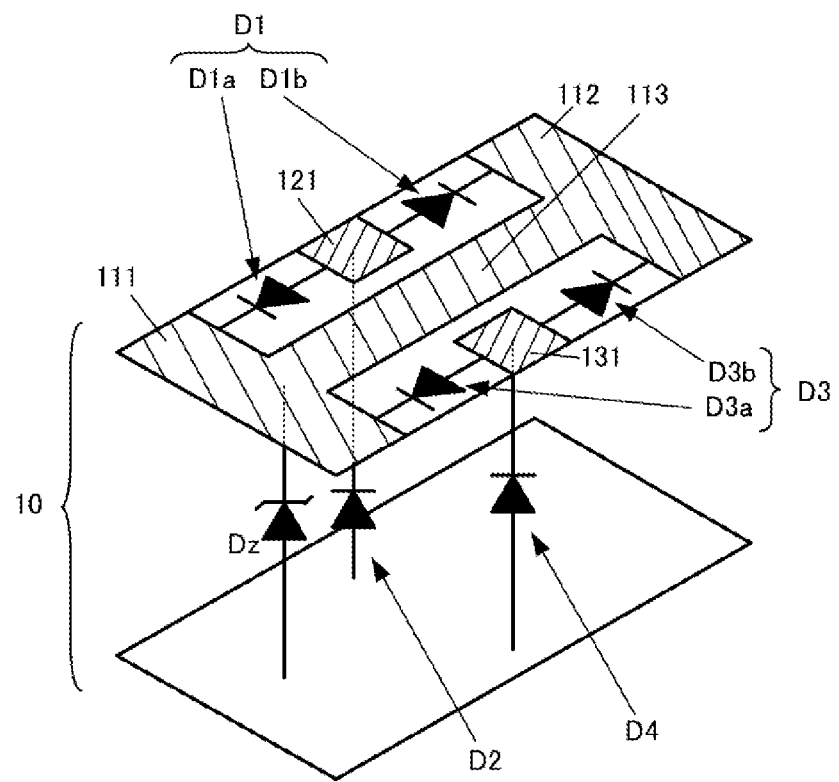
FIG. 4 is a diagram illustrating a structure example of the ESD protection circuit.

FIG. 4 is a diagram illustrating a structure example of the ESD protection circuit 10A.

As shown in FIG. 2, the Si substrate 10 has element forming regions formed, and the respective regions have Al electrode films 111, 112, 113, 121, 131 provided. The Al electrode films 111, 112, 113, 121, 131 herein are 1.0 μm or less in film thickness, and pattern widths are also several μm at narrow sites, and the adoption of a pattern layout that reduces the inductance component formed by the Al electrode films 111, 112, 113, 121, 131 is thus effective for the reduction of the entire ESL. The Al electrode films 111, 112 are provided to be parallel along the short sides of the Si substrate 10. The Al electrode film 113 is formed to be parallel to the long sides of the Si substrate 10, and electrically connected to the Al electrode film 111, 112. The region with the Al electrode films 111, 112, 113 provided has a zener diode Dz formed in the thickness direction of the Si substrate 10. It is to be noted that the direction along the long side corresponds to the longitudinal direction according to the present invention, whereas the direction along the short side corresponds to the shorter direction according to the present invention.

The Al electrode films 121, 131 are formed at both ends in the shorter direction of the Si substrate 10, and in roughly central parts in the longitudinal direction. More specifically, the Al electrode films 121, 131 are formed so as to have the Al electrode film 113 interposed therebetween, in regions surrounded by the Al electrode films 111, 112, 113. The Al electrode film 121 corresponds to a first input/output electrode according to the present invention, whereas the Al electrode film 131 corresponds to a second input/output electrode according to the present invention. A diode D2 is formed in the thickness direction of the Si substrate 10 in the region with the Al electrode film 121 provided, whereas a diode D4 is formed in the thickness direction of the Si substrate 10 in the region with the Al electrode film 131 provided.

The Al electrode film 121, 131 serve as input/output terminals of the ESD protection circuit 10A. Although described in detail later, the placement of the Al electrode films 121, 131 at both ends in the shorter direction of the Si substrate 10 can reduce the ESL and ESR between the Al electrode films 121, 131, that is, between the input and output terminals of the ESD protection circuit 10A. In particular, the reduced ESL can lower the clamp voltage of the ESD protection circuit 10A in a high-frequency band. This is because the reduced ESL shortens the time to application of an ESD voltage to each diode (1 ns or less) when the ESD protection element has ESD input, and the ESD protection circuit with the respective diodes is quickly operated.

Diode forming regions 141, 142, 143, and 144 are formed respectively between the Al electrode films 111, 121, between the Al electrode films 112, 121, between the Al electrode films 111, 131, and between the Al electrode films 112, 131. It is to be noted that while one of the diode forming regions 141, 142 and one of the diode forming regions 143, 144 may be eliminated, including all of the regions can further reduce the ESL.

The diode forming regions 141, 142, 143, 144 each have a pair of opposed comb-shaped electrode films formed, and diodes D1a, D1b (hereinafter, collectively referred to as a diode D1) and diodes D3a, D3b (hereinafter, collectively referred to as a diode D3) are formed in the respective regions. One of the comb-shaped electrode films in the diode forming region 141 is connected to the Al electrode film 111, whereas the other thereof is connected to the Al electrode film 121. One of the comb-shaped electrode films in the diode forming region 142 is connected to the Al electrode film 121, whereas the other thereof is connected to the Al electrode film 112. One of the comb-shaped electrode films in the diode forming region 143 is connected to the Al electrode film 111, whereas the other thereof is connected to the Al electrode film 131. One of the comb-shaped electrode films in the diode forming region 144 is connected to the Al electrode film 131, whereas the other thereof is connected to the Al electrode film 112. The formation of the diodes with the comb-shaped electrodes can constitute diodes that are low in ESL and high in ampacity in a limited occupied area.

It is to be noted that the diodes D1a, D1b and the diodes D3a, D3b are each formed so as to have forward directions opposite to each other on the surface of the Si substrate 10 as shown in FIG. 4. For this reason, when an electric current flows through each of the diodes D1a, D1b and diodes D3a, D3*b*, magnetic fields generated are generated in directions to cancel each other out. Thus, the inductance value on the current pathway can be reduced, and as a result, the increase in ESL can be suppressed.

Figure 5:
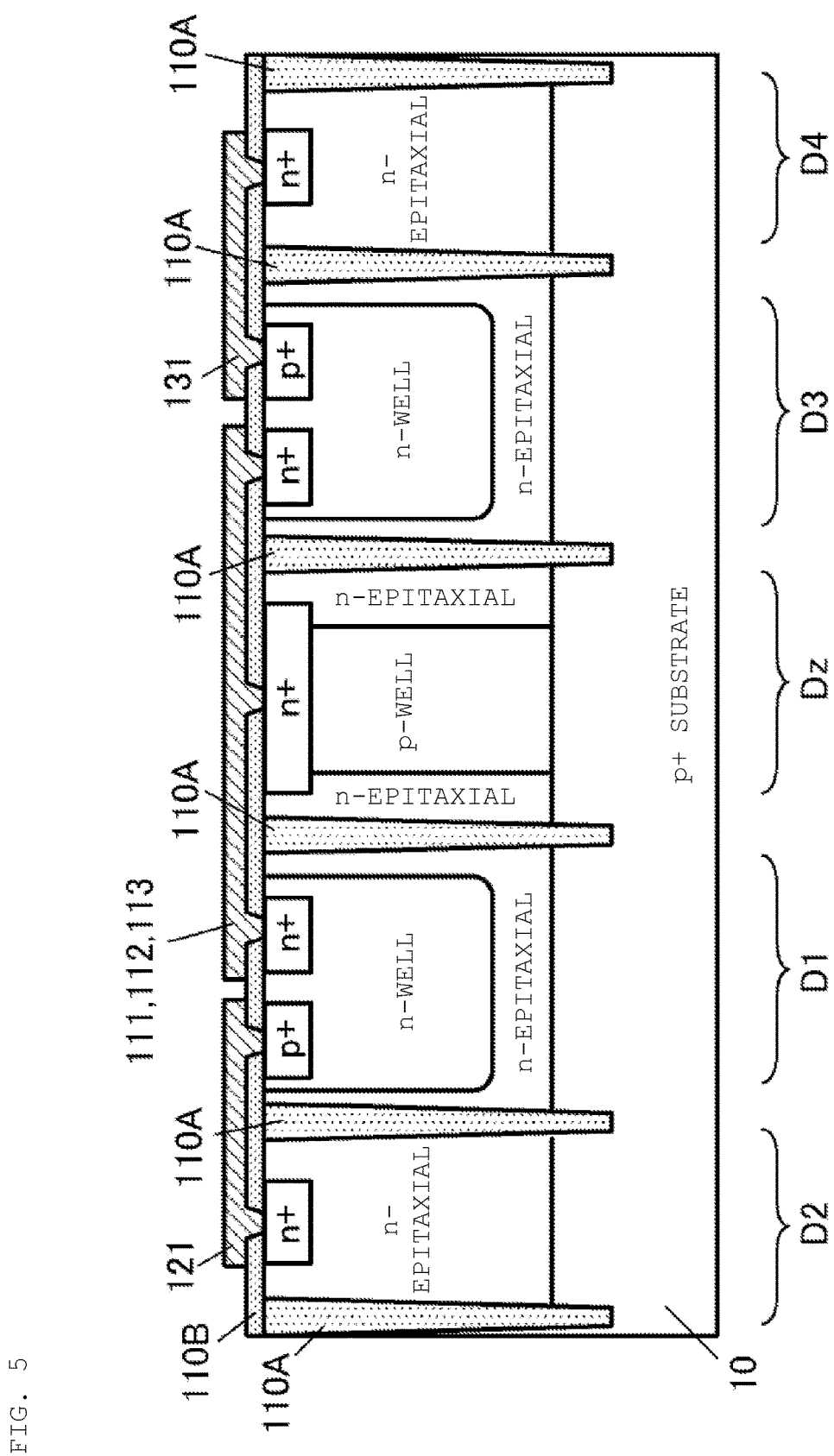
FIG. 5 is a pattern diagram of the Si substrate of the structure shown in FIG. 4.

The specific configuration of the Si substrate 10 will be described below. FIG. 5 is a pattern diagram of the Si substrate 10 of the structure shown in FIG. 4.

The Si substrate 10 is a p+ type substrate, and the p+ type substrate has element separation films 110A formed by a STI (Shallow Trench Isolation) method. The diodes D1 to D4 and the zener diode Dz are formed in the respective regions formed by the element separation film 110A. Specifically, an n-epitaxial layer is formed and n+ diffusion layers form the diodes D2, D4 in the thickness direction of the Si substrate 10. In addition, a p well is formed, and an n+ diffusion layer forms the zener diode Dz in the thickness direction of the Si substrate 10. Furthermore, n wells are formed in the n-epitaxial layers, and p+ diffusion layers and n+ diffusion layers form the diodes D1, D3 on the surface of the Si substrate 10.

On the surface of the Si substrate 10, a $SiO_2$ film 110B is formed, the Al electrode film 121 is formed so as to connect the an anode of the diode D1 and a cathode of the diode D2, and the Al electrode film 131 is formed so as to connect an anode of the diode D3 and a cathode of the diode D4. Furthermore, the Al electrodes 111, 121, 131 are formed on the diodes D1, D3, and the surface of the Si substrate 10, except the regions with the Al electrode films 121, 131 formed.

The thus formed ESD protection circuit 10A of the Si substrate 10 corresponds with the circuit shown in FIG. 3. The diodes D1, D2, D3, D4 and the zener diodes Dz correspond to functional elements according to the present invention.

The diodes D1, D2 are aligned in the forward direction and connected in series, whereas the diodes D3, D4 are aligned in the forward direction and connected in series. In addition, the diodes D1, D2 and the diodes D3, D4 are each aligned in the forward direction, and connected in parallel with the zener diode Dz. Furthermore, the zener diode Dz is formed between the forming regions of the diodes D1, D4, and between the forming regions of the diodes D2, D3.

Returning to FIG. 1, the rewiring layer 20 formed on the surface layer of the Si substrate 10 includes a protection film 21 formed on the surface of the Si substrate 10 and a resin layer 22. This protection film 21 is SiN or $SiO_2$. The protection film 21, which is made by sputtering on the surface of the Si substrate 10, has openings formed by etching. These openings are formed so as to partially expose the Al electrode films 121, 131 of the Si substrate 10. The resin layer 22 is formed by spin coating with an epoxy (or polyimide) solder resist. The resin layer 22 has contact holes 22A, 22B formed for exposing parts of the Al electrode films 121, 131.

Ti/Cu/Ti electrodes 24A, 24B are formed in the contact holes 22A, 22B and on regions around the contact holes 22A, 22B. The Ti/Cu/Ti electrodes 24A, 24B have planar parts opposed to the surface of the Si substrate 10, and have electrical connection to the Al electrode film 121, 131 through the contact holes 22A, 22B of the resin layer 22. The Ti/Cu/Ti electrodes 24A, 24B serve as current pathways for surge current (ESD current) through the ESD protection device 1.

External electrodes 23A, 23B of Au/Ni are formed partially on the planar parts of the Ti/Cu/Ti electrodes 24A, 24B. The parts of the Ti/Cu/Ti electrodes 24A, 24B, on which the external electrodes 23A, 23B are formed, are etched to have Cu exposed, and the exposed Cu parts are selectively etched with the external electrodes 23A, 23B. These external electrodes 23A, 23B serve as terminal electrodes for input/output to/from the ESD protection device 1. The Ti/Cu/Ti electrode 24A corresponds to a first wiring electrode according to the present invention, whereas the Ti/Cu/Ti electrode 24B corresponds to a second wiring electrode according to the present invention.

The Ti/Cu/Ti electrode 24A is opposed to the Al electrode films 112, 121 and diode forming region 142 formed in the Si substrate 10 in the thickness direction of the ESD protection device 1. The Ti/Cu/Ti electrode 24B is opposed to the Al electrode films 111, 131 and diode forming region 143 formed in the Si substrate 10 in the thickness direction of the ESD protection device 1. The external electrodes 23A, 23B cover the zener diode Dz formed in the Si substrate 10 to prevent noise radiation from the zener diode.

The rewiring layer 20 includes a resin layer 26 further formed on the resin layer 22. The resin layer 26 is, for example, a layer of low-dielectric-constant epoxy resin. Parts of the resin layer 26, which are opposed to parts of the external terminal electrodes 23A, 23B treated as input/output terminals of the ESD protection device 1, have rectangular openings 26A, 26B formed. The openings 26A, 26B are formed at both ends (near the short sides of the Si substrate 10) in longitudinal direction, as shown in FIG. 2. Thus, the ESD protection device 1 has input/output parts at both ends in the longitudinal direction, and makes it easy to mount the ESD protection device 1 onto a substrate.

It is to be noted that while an example of forming the zener diode Dz and the like in the Si substrate 10 to constitute the ESD protection circuit 10A has been provided in the present embodiment, for example, a PNP-type semiconductor or an NPN-type semiconductor may be formed in the Si substrate 10 to constitute a circuit with the use of the semiconductor.

Connection examples and a principle for operation will be described below with the ESD protection device according to the present embodiment.

Figure 6A:
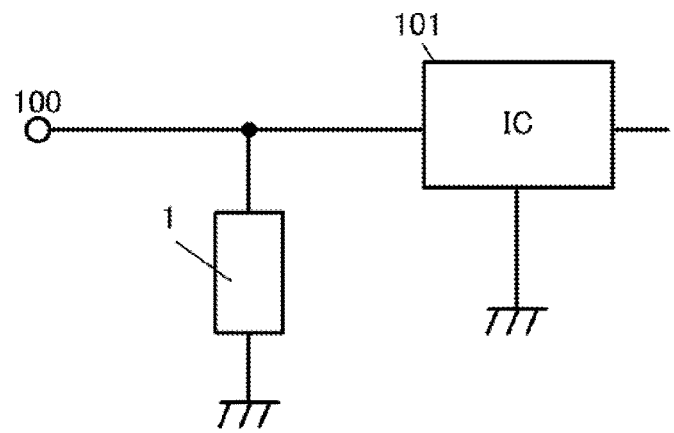
FIG. 6A is a diagram illustrating an example of connecting an ESD protection device according to an embodiment.
Figure 6B:
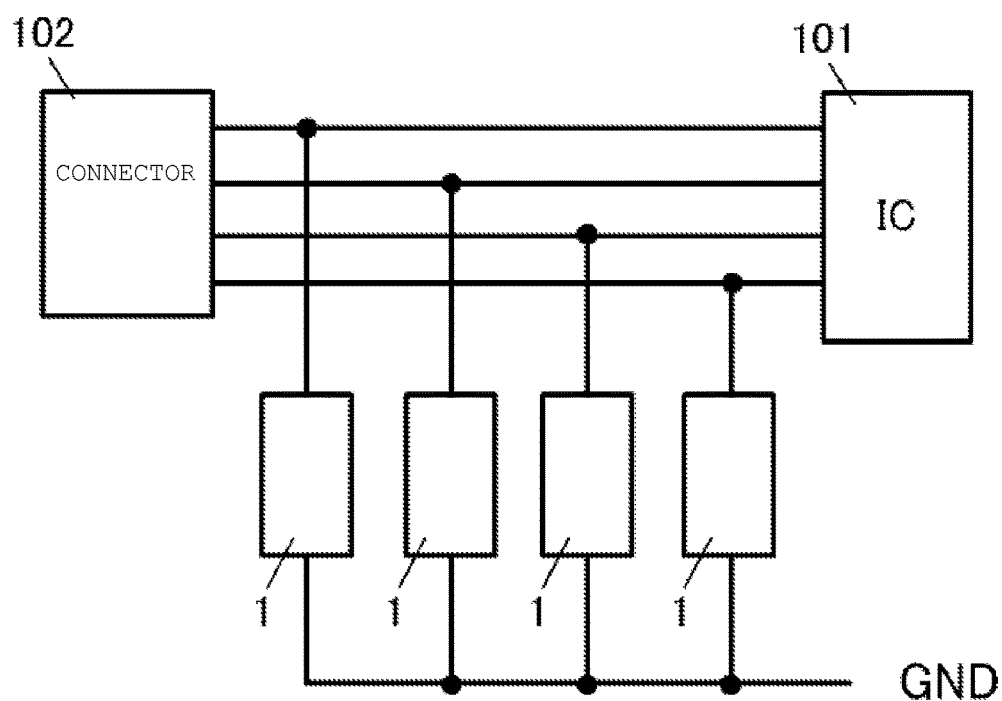
FIG. 6B is a diagram illustrating an example of connecting an ESD protection device according to an embodiment.

FIGS. 6A and 6B are diagrams illustrating examples of connecting the ESD protection device 1 according to the present embodiment. The ESD protection device 1 is mounted on an electronic device. Examples of the electronic device include laptop PCs, tablet terminals, cellular phones, digital cameras, and portable music players.

FIG. 6A shows an example of connecting the ESD protection device 1 between a signal line connecting an I/O port 100 and an IC 101 to be protected, and GND. The I/O port 100 is, for example, a port to which an antenna is connected. The ESD protection device 1 according to the present embodiment is bidirectional, and any of the first input/output terminal and second input/output terminal may serve as an input terminal. For example, when the first input/output terminal is treated as an input terminal, the first input/output terminal is connected to the signal line, whereas the second input/output terminal is connected to the GND.

FIG. 6B shows an example of connecting the ESD protection devices 1 between signal lines connecting a connector 102 and an IC 101, and a GND line. The signal lines in this example are, for example, high-speed transmission lines (differential transmission lines), and the ESD protection device 1 is connected between each of the multiple signal lines and the GND line.

Figure 7:
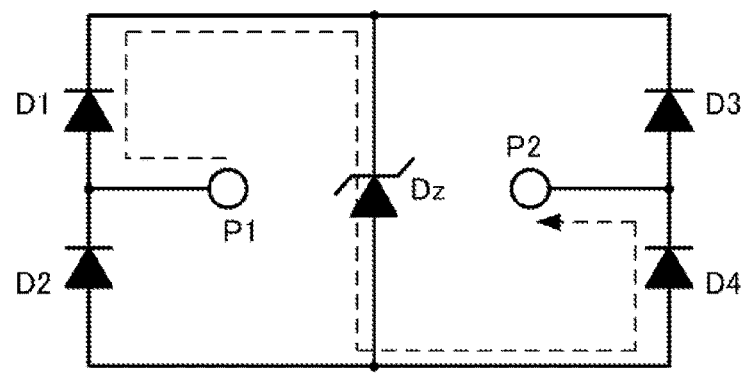
FIG. 7 is a diagram for explaining a principle for operation of an ESD protection device according to an embodiment.
Figure 8:
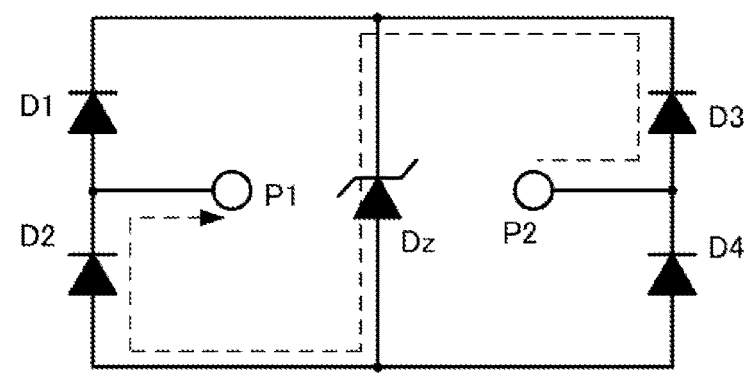
FIG. 8 is a diagram for explaining a principle for operation of an ESD protection device according to an embodiment.

FIGS. 7 and 8 are diagrams for explaining a principle for operation of the ESD protection device according to the present embodiment. It is to be noted that the diode D1*a*, D1*b* are expressed by a diode D1, whereas the diode D3*a*, D3*b* are expressed by a diode D3 in FIGS. 7 and 8.

FIG. 7 is a diagram for explaining a case in which a current flows from an input/output port P1 (Al electrode film 121) leading to the first input/output terminal (external electrode 23A), to an input/output port P2 (Al electrode film 131) leading to the second input/output terminal (external electrode 23B). When a surge voltage in excess of the zener voltage of the zener diode Dz is applied, a surge current coming from the first input terminal flows through a pathway from the input/output port P1 to the diode D1, the zener diode Dz, and the diode D4, and is discharged from the input/output port P2 to the ground, as indicated by a dashed line in the figure.

FIG. 8 is a diagram for explaining a case in which a current flows from the input/output port P2 leading to the second input/output terminal (external electrode 23B), to the input/output port P1 leading to the first input/output terminal (external electrode 23A). In this case, as indicated by a dashed line in the figure, a surge current coming from the second input terminal flows through a pathway from the input/output port P2 to the diode D3, the zener diode Dz, and the diode D2, and is discharged from the input/output port P1 to the ground.

Next, the reason that the ESD protection device 1 according to the present embodiment can suppress ESL will be described.

Figure 9:
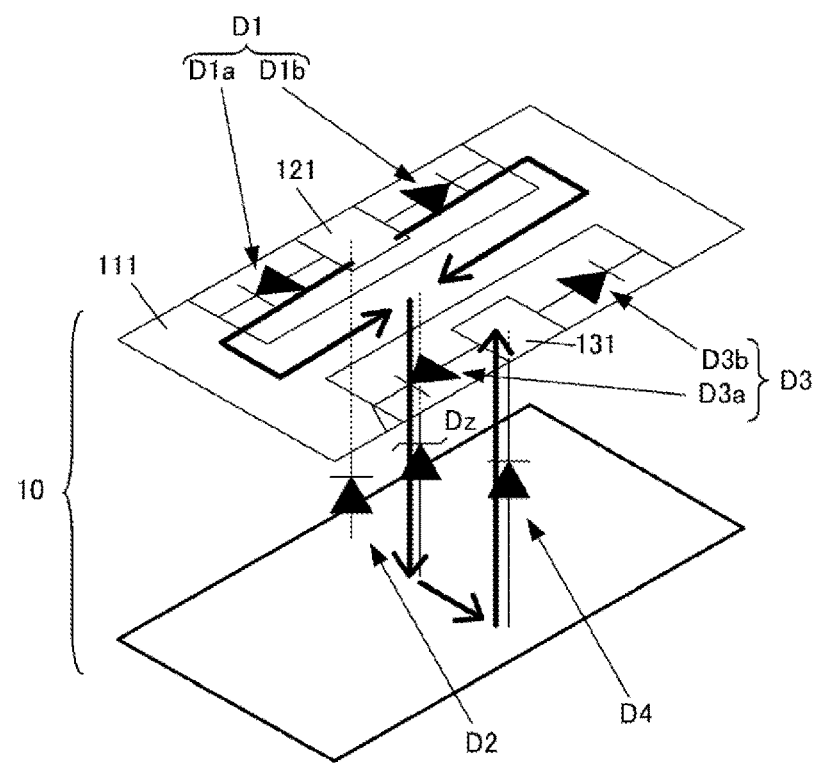
FIG. 9 is a diagram illustrating the pathway of a current that flows through an ESD protection circuit according to an embodiment.
Figure 10:
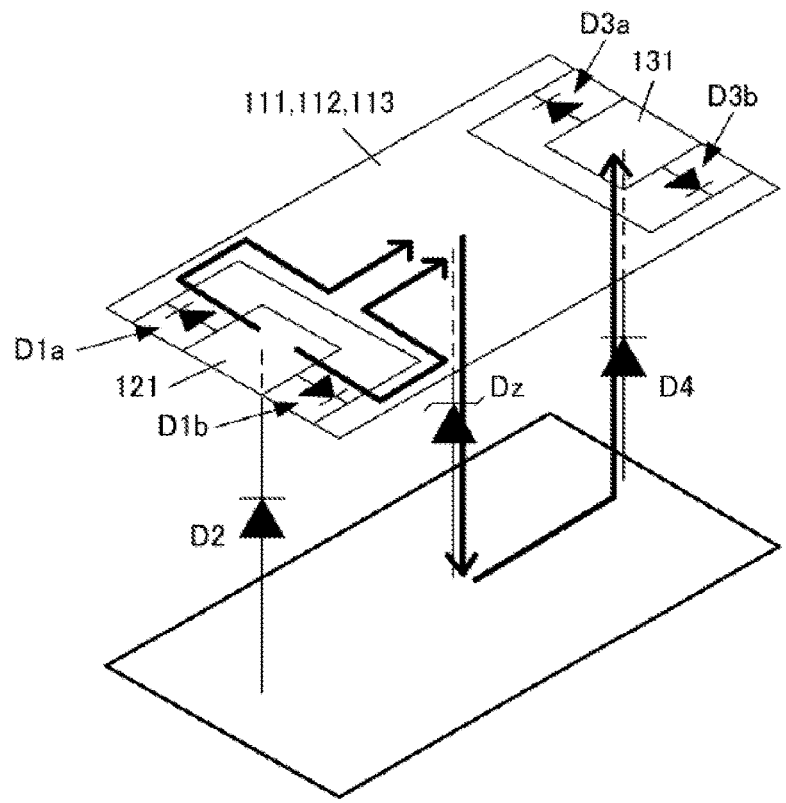
FIG. 10 is a diagram illustrating the pathway of a current that flows through an ESD protection circuit when Al electrode films that are input/output terminals of the ESD protection circuit are provided near short sides of a Si substrate, for comparison with the embodiment.

FIG. 9 is a diagram illustrating the pathway of a current that flows through the ESD protection circuit 10A according to the present embodiment. FIG. 10 is a diagram illustrating the pathway of a current that flows through the ESD protection circuit 10A when the Al electrode films 121, 131 which are input/output terminals of the ESD protection circuit 10A are provided near the short sides of the Si substrate 10, for comparison with the present embodiment.

FIGS. 9 and 10 show a case in which an ESD current flows from the Al electrode film 121 to the Al electrode film 131. In this case, the current input from the Al electrode film 121 flows from the diodes D1a, D1b through the zener diode Dz, further through the diode D4 to the Al electrode film 131. The Al electrode films 121, 131 are formed respectively on the long sides of the Si substrate 10 in the present embodiment, whereas the Al electrode films 121, 131 are formed on the short sides of the Si substrate 10 in FIG. 10. More specifically, the distance between the zener diode Dz and diode D4 formed in the thickness direction of the Si substrate 10 is shorter in the present embodiment, as compared with FIG. 10. In other words, the current pathway in the flow from the zener diode Dz to the diode D4 is shorter in the present embodiment, as compared with FIG. 10.

For this reason, the ESL of the ESD protection device 1 according to the present embodiment is low as compared with the configuration in FIG. 10. From this figure, it is determined that the reduced ESL leads to a reduction in transmission loss in a high-frequency band in the structure in FIG. 6A. The reduced ESL not only lowers the clamp voltage of ESD, but also has the effect of improving the ESD protection element in terms of transmission loss on the high-frequency signal line. Therefore, the reduction also leads to improvements in terms of transmission loss on high-frequency transmission lines such as, USB 3.0, for example.

Figure 11:
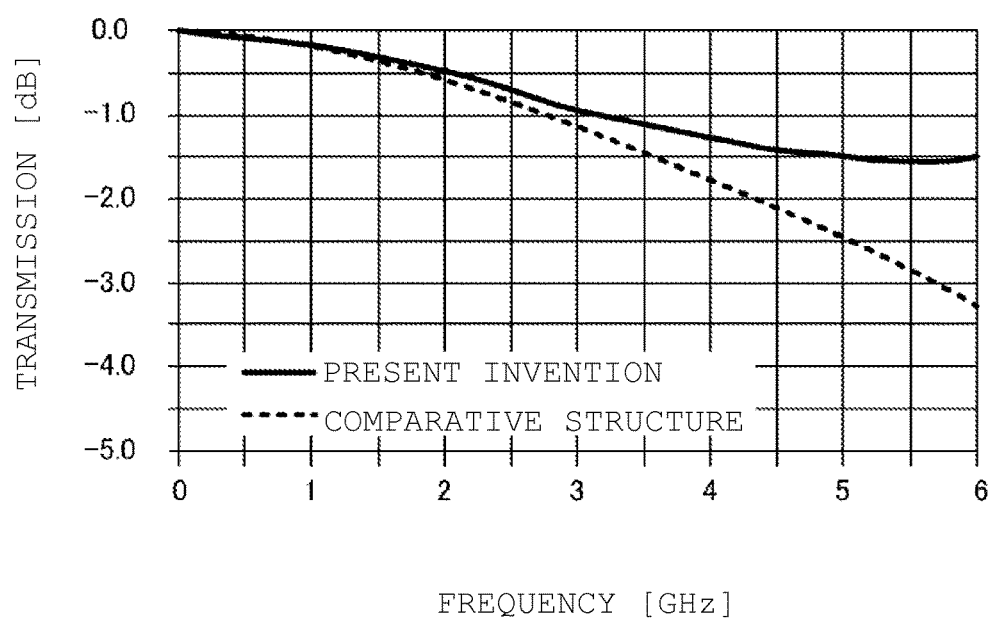
FIG. 11 is a diagram showing bandpass characteristics of a signal line with an ESD protection device connected thereto.

FIG. 11 is a diagram showing bandpass characteristics of a signal line with the ESD protection device 1 connected thereto. FIG. 11 shows bandpass characteristics (solid line) from the I/O port 100 to the IC 101 in the case of connection as shown in FIG. 6A, for example, and also shows bandpass characteristics (dashed line) in the case of connecting an ESD protection device that has the structure shown in FIG. 10 by way of comparison.

As indicated by the dashed line in FIG. 11, when the ESD protection device is connected which has the structure shown in FIG. 10, the decay is increased from 3 GHz. In contrast, when the ESD protection device 1 according to the present embodiment is connected, the signal decay is small even in a high-frequency band of 3 GHz or more, as indicated by the solid line in FIG. 11. As just described, the ESD protection device 1 which has the structure shown in FIG. 10 according to the present embodiment functions adequately even in use in high-frequency bands, by suppressing the generation of ESL.

Figure 12:
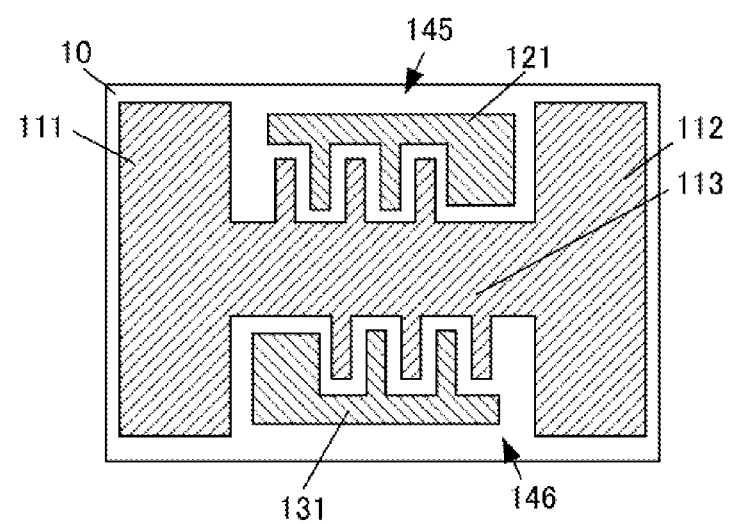
FIG. 12 is a diagram illustrating another structure example of an ESD protection circuit formed in a Si substrate.

It is to be noted that the structure of the ESD protection circuit 10A is not limited to that described above. FIG. 12 is a diagram illustrating another structure example of the ESD protection circuit 10A formed in the Si substrate 10. In this example, diode forming regions 145, 146 are formed in respective regions surrounded by Al electrode films 111, 112, 113 with Al electrode films interposed therebetween. Al electrode films 121, 131 to serve as input/output parts are formed in the diode forming regions 145, 146. Furthermore, diodes are formed with comb-shaped electrode films formed for each of the Al electrode films 121, 131 and Al electrode film 113. The diodes formed in the diode forming regions 145, 146 correspond to the diodes D1, D3 shown in FIG. 3. In addition, the diodes D2, D4 (see FIG. 3) are formed in the thickness direction of the Si substrate 10 in the regions with the Al electrode films 121, 131 formed. Even in this configuration, the distance between the Al electrode films 121, 131 is shorter than in the case of the structure shown in FIG. 10, and ESL can be reduced.

A process for manufacturing the ESD protection device will be described below.

Figure 13:
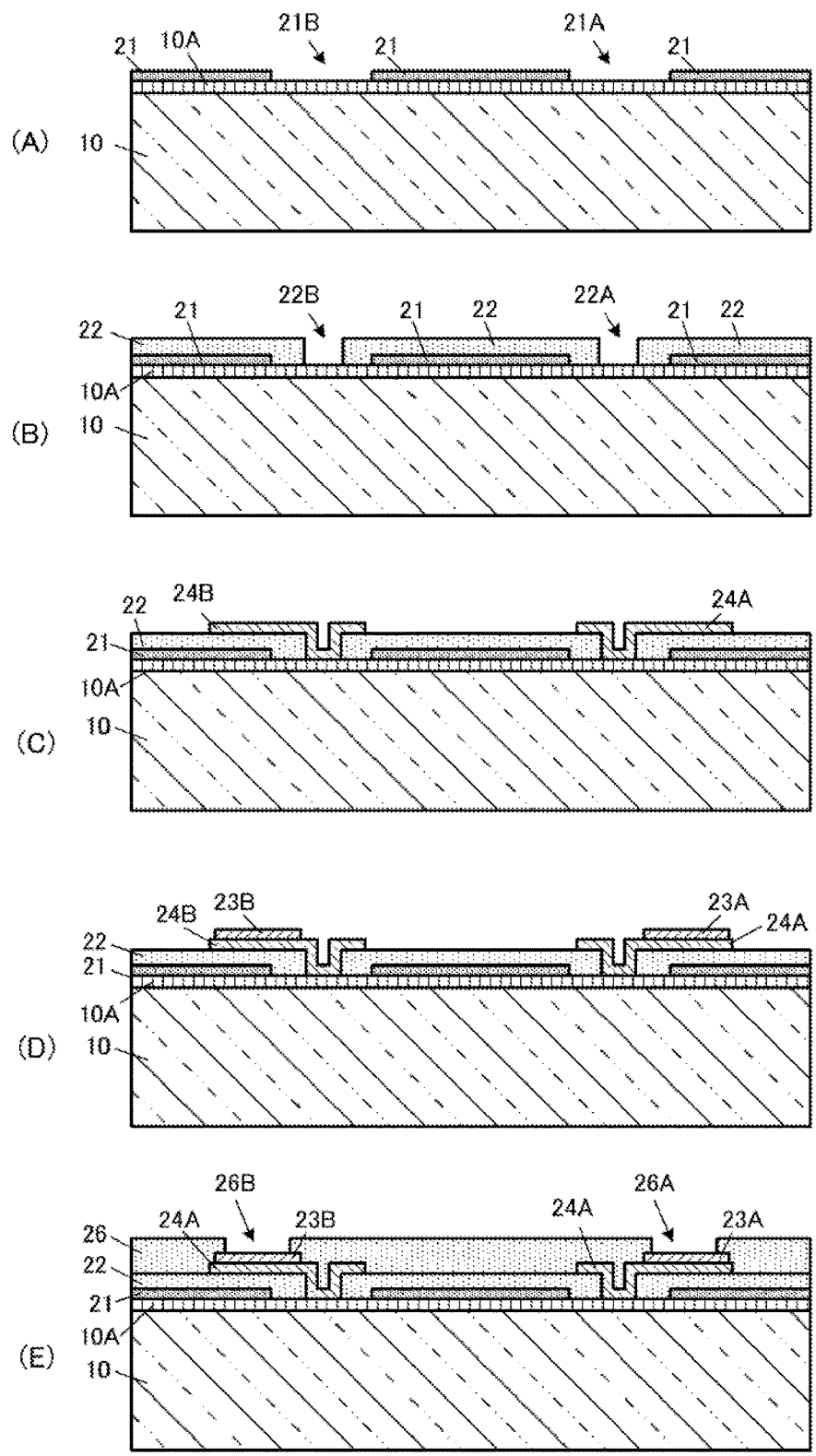
FIG. 13 is a diagram illustrating a process for manufacturing an ESD protection device.

FIG. 13 is a diagram illustrating a process for manufacturing the ESD protection device 1. The ESD protection device 1 is manufactured in accordance with the following process.

(A) First, an insulating film is formed on the Si substrate 10 with the ESD protection circuit 10A formed, openings are provided at predetermined sites of the insulating film, and the Al electrode films 111, 112, 113, 121, 131 are formed by vapor deposition. Further, the protection film 21 is made by sputtering onto the surface of the Si substrate 10, and openings 21A, 21B are formed by etching.

(B) Next, the Si substrate 10 is subjected to spin coating with an epoxy solder resist to form the resin layer 22, and the contact holes 22A, 22B are formed. The formation of the resin layer 22 can achieve leveling of the surfaces on which the Ti/Cu/Ti electrodes 24A, 24B are formed.

(C) On the surface of the resin layer 22, Ti/Cu/Ti are deposited by sputtering to be approximately 0.1 μm/1.0 μm/0.1 μm in thickness, and then subjected to wet etching to form the electrodes 24A, 24B.

(D) The surfaces of the Ti/Cu/Ti electrodes 24A, 24B are partially etched to expose Cu, and on the exposed Cu parts, the external electrodes 23A, 23B of Au/Ni are deposited by electrolytic plating (electroplating) to be approximately 0.1 μm/3.0 μm in thickness. With the external electrodes 23A, 23B, only the exposed Cu parts are selectively plated. The deposition of the external electrodes 23A, 23B by selective plating facilitates the manufacture without forming any resist film, and because any masking is required.

(E) Thereafter, the surface of the resin layer 22 is subjected to spin coating with an epoxy solder resist to form the resin layer 26. The openings 26A, 26B are formed in the resin layer 26.

Figure 14:
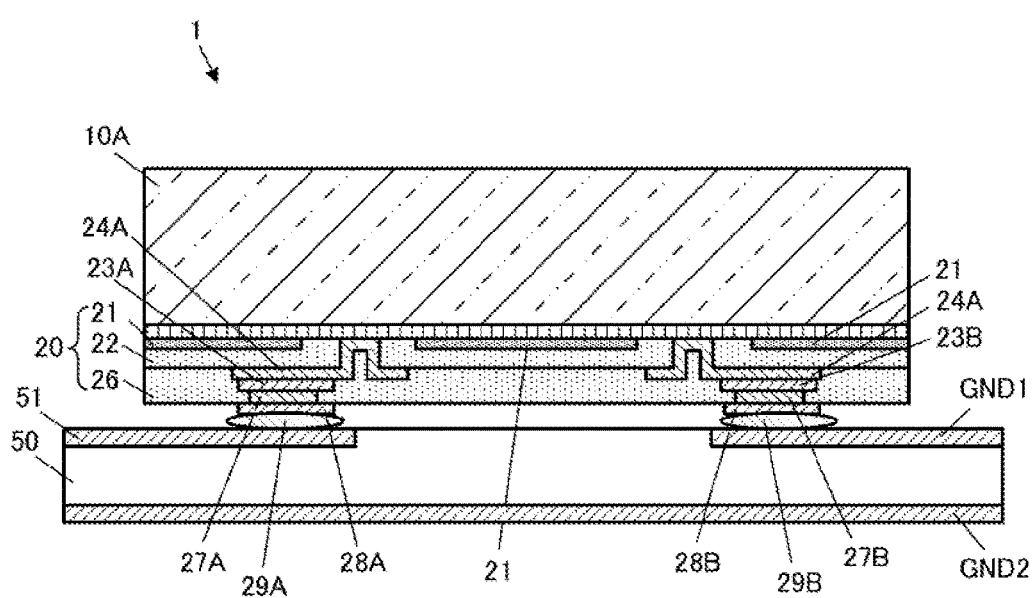
FIG. 14 is a diagram illustrating a connection structure of an ESD protection device 1.

FIG. 14 is a diagram illustrating a connection structure of the ESD protection device 1.

In the resin layer 26 of the ESD protection device 1, columnar in-layer electrodes 27A, 27B of Cu are formed which are connected to the external electrodes 23A, 23B. Furthermore, the surface of the resin layer 26 has metal plated films 28A, 28B such as Ni/Au or Ni/Sn formed. Solder bumps 29A, 29B are provided on the metal plated films 28A, 28B, and the ESD protection device 1 is mounted over a substrate 51 with the solder bumps 29A, 29B interposed therebetween.

The mounting surface of the substrate 50 with the ESD protection device 1 mounted has wiring patterns of signal line 51 and ground GND 1 formed. In addition, the rear surface of the substrate 50 has a wiring pattern of ground GND 2 formed. The protection device 1 is mounted so that the solder bump 29A is connected to the signal line 51, whereas the solder bump 29B is connected to the ground GND 1.

Thus, the current flowing through the signal line 51 of the substrate 50 flows to the input/output port P1 of the ESD protection device 1, passes through the ESD protection circuit 10A, and flows from the input/output port P2 to the ground GND 1. If the substrate 50 and the external electrodes 23A, 23B of the ESD protection device 1 are connected by wire bonding, the wire-bonded part has an inductor component, thereby generating ESL. In addition, the wire bonding acts as an antenna to radiate noises of high-frequency components to the outside. Therefore, the generation of ESL due to wire bonding can be suppressed by mounting the ESD protection device 1 on the substrate 50 as shown in FIG. 14. In addition, noise radiation from the ESD pathway to the outside can be prevented by sandwiching the ESD protection circuit 10A as an ESD pathway between the Si substrate 10 and the ground GND 2. As just described, the ESD protection device 1 functions adequately even in use in high-frequency bands.

Furthermore, parasitic capacitance is generated at the site without the ground GND 1 provided, between the ESD protection circuit 10A of the ESD protection device 1 and the ground GND1 which are opposed. This parasitic capacitance lowers the impedance of the ESD pathway, and the ESL can be further reduced.

DESCRIPTION OF REFERENCE SYMBOLS

1 ESD protection device
10 Si substrate (semiconductor substrate)
10A ESD protection circuit
20 rewiring layer
21 protection film
22,26 resin layer
22A, 22B contact hole
23A, 23B external electrode
24A, 24B Ti/Cu/Ti electrode
26A contact hole (first contact hole)
26B contact hole (second contact hole)
111,112,113 Al electrode film
121 Al electrode film (first input/output electrode)
131 Al electrode film (second input/output electrode)
D1, D2, D3, D4 diode (functional element)
Dz zener diode (functional element)

The invention claimed is:

1. An electro static discharge (ESD) protection device comprising:
   a zener diode formed in a semiconductor substrate;
   a first series circuit formed in the semiconductor substrate and coupled in parallel to the zener diode, the first series circuit having first and second diodes;
   a second series circuit formed in the semiconductor substrate and coupled in parallel to the zener diode, the second series circuit having third and fourth diodes connected in series;
   a first input/output electrode disposed on the surface of the semiconductor substrate and coupled to a first node between the first and second diodes; and
   a second input/output electrode disposed on the surface of the semiconductor substrate and coupled to a second node between the third and fourth diodes,
   wherein the first diode comprises two diodes electrically coupled in parallel between the first node and the zener diode, with the two diodes extending in a planar direction of the semiconductor substrate.

2. The ESD protection device according to claim 1, wherein the first series circuit and the second series circuit are and aligned in a same direction as the zener diode.

3. The ESD protection device according to claim 1, wherein the first diode and the third diode are formed on the surface of the semiconductor substrate.

4. The ESD protection device according to claim 3, wherein the second diode and the fourth diode are formed in a thickness direction of the semiconductor substrate.

5. The ESD protection device according to claim 4,
   wherein the semiconductor substrate has a first length in a longitudinal direction and a second length shorter than the first length that is in a direction orthogonal to the longitudinal direction in a planar view of the semiconductor substrate, and
   wherein the first input/output electrode and the second input/output electrode are formed at both ends in the shorter direction of the semiconductor substrate.

6. The ESD protection device according to claim 1, further comprising a rewiring layer disposed on the surface of the semiconductor substrate.

7. The ESD protection device according to claim 6, wherein the rewiring layer comprises:
   a first wiring electrode and a second wiring electrode opposed to the surface of the semiconductor substrate;
   a first contact hole that electrically connects the first input/output electrode and at least a portion of the first wiring electrode; and
   a second contact hole that electrically connects the second input/output electrode and at least a portion of the second wiring electrode.

8. The ESD protection device according to claim 7, wherein the rewiring layer further comprises a first opening and a second opening formed in planar view, the first opening and the second opening partially exposing the first wiring electrode and the second wiring electrode.

9. The ESD protection device according to claim 8, wherein the first opening and the second opening are formed at both ends in the longitudinal direction of the semiconductor substrate.

10. The ESD protection device according to claim 1, wherein either of the two diodes of the first diode is connected in series to the second diode and with the second diode connected collectively in parallel to the zener diode.

11. The ESD protection device according to claim 1, wherein the third diode comprises two diodes opposite to each other in the forward direction from the second input/output electrode in the planar direction of the semiconductor substrate.

12. The ESD protection device according to claim 11, wherein either of the two diodes of the third diode is connected in series to the fourth diode and with the fourth diode connected collectively in parallel to the zener diode.

13. The ESD protection device according to claim 1, wherein the semiconductor substrate is a p+ type substrate.

14. The ESD protection device according to claim 13, wherein a p well and an n+ diffusion layer are formed in the p+ type substrate to form the zener diode in the thickness direction of semiconductor substrate.

15. The ESD protection device according to claim 14, wherein an n-epitaxial layer and n+ diffusion layers are formed in the p+ type substrate to form each of the second and fourth diodes.

16. The ESD protection device according to claim 15, wherein n wells are formed in the n-epitaxial layer and p+ diffusion layers and additional n+ diffusion layers form the first diode and the third diode on the surface of the semiconductor substrate.

17. An electro static discharge (ESD) protection device comprising:
   a zener diode formed in a semiconductor substrate;
   a first circuit formed in the semiconductor substrate, the first series circuit having a first diode and a second diode aligned in a forward direction and connected in series, and aligned in the forward direction and connected in parallel with the zener diode;
   a second circuit formed in the semiconductor substrate, the second series circuit having a third diode and a fourth diode aligned in a forward direction and connected in series, and aligned in the forward direction and connected in parallel with the zener diode;
   a first input/output electrode connected to a connection point between the first diode and the second diode, and formed on the surface of the semiconductor substrate; and
   a second input/output electrode connected to a connection point between the third diode and the fourth diode, and formed on the surface of the semiconductor substrate,
   wherein the first diode and the third diode are disposed on the surface of the semiconductor substrate,
   the second diode and the fourth diode are disposed in a thickness direction of the semiconductor substrate,
   the first diode comprises two diodes electrically coupled in parallel between the first input/output electrode and the second input/output electrode, with the two diodes extending in the planar direction of the semiconductor substrate,
   the third diode comprise two diodes electrically coupled in parallel between the second input/output electrode and the first input/output electrode, with the two diodes extending in the planar direction of the semiconductor substrate,
   the semiconductor substrate has a longitudinal direction and a shorter direction orthogonal to the longitudinal direction in planar view, and
   the first input/output electrode and the second input/output electrode are disposed at both ends in the shorter direction of the semiconductor substrate.

18. The ESD protection device according to claim 17, wherein the two diodes of the first diode are connected in parallel with each other, and the two diodes of the second diode are connected in parallel with each other.

19. The ESD protection device according to claim 17, further comprising a rewiring layer disposed on the surface of the semiconductor substrate,
   wherein the rewiring layer comprises a first wiring electrode and a second wiring electrode opposed to the surface of the semiconductor substrate, a first contact hole that electrically connects the first input/output electrode and a part of the first wiring electrode, and a second contact hole that electrically connects the second input/output electrode and a part of the second wiring electrode,
   wherein the rewiring layer has a first opening and a second opening disposed in a planar view, the first opening and the second opening partially exposing the first wiring electrode and the second wiring electrode, and
   wherein the first opening and the second opening are disposed at both ends in the longitudinal direction of the semiconductor substrate.

* * * * *